United States Patent [19]

Feldman

[11] Patent Number: 5,017,452
[45] Date of Patent: May 21, 1991

[54] METHOD FOR IMAGE DEVELOPING ON PLAIN PAPER UTILIZING A DEVELOPER-DONOR SHEET

[75] Inventor: Lyudmila Feldman, Centerville, Ohio

[73] Assignee: The Mead Corporation, Dayton, Ohio

[21] Appl. No.: 454,102

[22] Filed: Dec. 20, 1989

[51] Int. Cl.⁵ .............................................. G03C 1/733
[52] U.S. Cl. ..................................... 430/138; 430/200; 430/203; 430/211; 355/27; 355/30; 355/32
[58] Field of Search ............... 430/138, 200, 203, 210, 430/211; 355/27, 30, 32

[56] References Cited

U.S. PATENT DOCUMENTS

| | | | |
|---|---|---|---|
| 4,399,209 | 8/1983 | Sanders et al. | 430/211 |
| 4,440,846 | 4/1984 | Sanders et al. | 430/211 |
| 4,622,282 | 11/1986 | Head et al. | 430/138 |
| 4,663,266 | 5/1987 | Adair et al. | 430/138 |
| 4,701,397 | 10/1987 | Rourke et al. | 430/138 |
| 4,751,165 | 6/1988 | Rourke et al. | 430/138 |
| 4,877,767 | 10/1989 | Liang et al. | 430/138 |

FOREIGN PATENT DOCUMENTS 2202641 9/1988 United Kingdom .

OTHER PUBLICATIONS

"One Step Lamination and Development of Receiver Sheet for Imaging Systems Employing Photohardenable Microcapsules", L. Feldman, *Research Disclosure*, Feb. 1989, 2 pages.

Primary Examiner—Hoa Van Le
Attorney, Agent, or Firm—Thompson, Hine and Flory

[57] ABSTRACT

A method for forming images on plain paper is disclosed, comprising the steps of: image-wise exposing an imaging sheet, said imaging sheet comprising a support having a layer of photosensitive microcapsules on the surface thereof, said microcapsules containing a photohardenable or photosoftenable composition including a photoinitiator, and a color precursor; assembling said image-wise exposed imaging sheet with a sheet of plain paper; subjecting said assembly of said imaging sheet and said plain paper to a uniform rupturing force to cause said photosensitive microcapsules to rupture and transfer an image-wise pattern of said color precursor to said plain paper thereby forming a latent image thereon; separating said imaging sheet from said plain paper; assembling said plain paper bearing said latent image with a developer-donor sheet comprising a support having a layer of a developer on the surface thereof to form a second assembly; subjecting said second assembly to a uniform force to transfer said developer to said plain paper bearing said latent image whereupon said developer reacts with said color precursor to form a visible image.

6 Claims, 3 Drawing Sheets

METHOD FOR IMAGE DEVELOPING ON PLAIN PAPER UTILIZING A DEVELOPER-DONOR SHEET

BACKGROUND OF THE INVENTION

1. Field of the Invention

The present invention relates to an imaging system. More particularly, the present invention relates to a method for developing an image on plain paper wherein a color precursor is associated with an imaging sheet in an image-wise pattern and a film of a developer material is subsequently associated with the imaging sheet to produce an image.

2. Description of the Prior Art

Photosensitive imaging systems employing microencapsulated radiation-sensitive compositions (also known as cylithographic imaging systems) are the subject of commonly assigned U.S. Pat. Nos. 4,399,209, 4,772,541 and 4,842,976 to The Mead Corporation. These imaging systems are characterized in that an imaging sheet including a layer of microcapsules containing a photosensitive composition in the internal phase is image-wise exposed to actinic radiation. In the most typical embodiments, the photosensitive composition is a photopolymerizable composition including a polyethylenically unsaturated compound and a photoinitiator and is encapsulated with a color precursor. Exposure image-wise hardens the internal phase of the microcapsules. Following exposure, the imaging sheet is subjected to a uniform rupturing force by passing the sheet in contact with a developer sheet through the nip between a pair of pressure rollers whereupon the color precursor is transferred to the developer sheet where it reacts to form an image.

Techniques have been disclosed for forming images on plain paper. In U.S. Pat. No. 4,622,282 issued Nov. 11, 1986 a process is disclosed which comprises image-wise exposing an imaging sheet to actinic radiation. The imaging sheet includes a support having a layer of microcapsules containing a photosensitive composition and a chromogenic material on the surface. The sheet is subjected to a uniform rupturing force in contact with a sheet of plain paper. The chromogenic material is image-wise transferred to the sheet of plain paper and the surface of the sheet of plain paper now carrying the chromogenic material is then contacted with a developer material to form a visible image.

In accordance with one embodiment of the invention described in U.S. Pat. No. 4,622,282, the developer material is provided on the surface of the imaging sheet with the microcapsules containing the chromogenic material. The developer may be provided in admixture with the microcapsules in a single layer on the surface of the imaging sheet, but embodiments are also possible in which the developer is provided in a separate layer underlying the layer of microcapsules. With the developer present on the surface of the imaging sheet, images are formed by simply image-wise exposing the sheet to actinic radiation, subjecting the sheet to a uniform rupturing force in contact with plain paper, and effecting transfer to the surface of the plain paper. The developer and the chromogenic material begin to react as they are transferred to the surface of the plain paper.

As disclosed in U.S. Pat. No. 4,622,282, when the developer is not present on the imaging sheet, after transfer of the chromogenic material to the plain paper, the paper is contacted with a developer material and the image is developed through reaction of the chromogenic material and the developer. In one embodiment the paper is contacted with a rotating developer applicator brush. The brush applies a developer material onto the surface of paper where it reacts with the chromogenic material and produces the color image. However, brush application of the developer is disadvantageous as it is often accompanied by streaking, loss of resolution and cross-colorization due to brush contamination as the brush may carry precursor and/or developer across the surface of the paper to undesired areas.

U.S. Pat. No. 4,701,397 teaches another method for forming images on plain paper wherein a layer of microcapsules and developer is area-wise transferred to the surface of a plain sheet of paper to form an image. In this method, the microcapsules and developer are coated in a single layer or as separate layers on a thin polymeric film. The sheet is image-wise exposed to actinic radiation, assembled with a sheet of plain paper and subjected to pressure whereupon, in the image areas, the layer of developer is transferred (selectively adhered) to the paper and an image is formed.

U.K. Patent Application 2 202 641 discloses a method for copying on paper or cloth using the cylithographic system wherein a wax is incorporated in the developer layer. The method relies upon two transfer steps. In the first, the image-wise exposed imaging sheet is assembled with developer sheet wherein the developer is provided on the surface of a temporary support and pressure is applied in the usual manner and an image is formed on the developer sheet. The developer sheet is then juxtaposed a sheet of paper and pressure and heat are applied whereupon the developer layer is transferred as a continuous film to the paper surface.

SUMMARY OF THE INVENTION

In accordance with this invention images are formed on plain paper by a process which comprises image-wise exposing an imaging sheet including a support having a layer of photosensitive microcapsules on the surface thereof, said microcapsules containing a photohardenable or photosoftenable composition and color precursor. The imaging sheet is assembled with a sheet of plain paper and the microcapsules are subjected to a uniform rupturing force. Typically the color precursor is released image-wise from the microcapsules and transferred to a sheet of plain paper in the pattern of an image. The color precursor on the surface of the paper is subsequently developed by contacting the plain paper sheet with a developer-donor sheet.

The developer-donor sheet of the present invention is comprised of a support having a layer of developer material disposed thereon. This sheet may take several forms. For example, the developer material may be microencapsulated or a developer composition or a developer resin having the properties similar to a hot melt adhesive may be transferred as a film to the surface of the paper. As a further alternative, the developer donor may take the form of a microporous film which is saturated with a solution of a developer material. An image is formed when said developer material is transferred to said plain paper sheet and reacts with the color precursor previously transferred to the plain paper sheet.

In accordance with one embodiment of the present invention, a method for forming images on plain paper is provided comprising the steps of:

image-wise exposing an imaging sheet, said imaging sheet comprising a support having a layer of photosensitive microcapsules on the surface thereof, said microcapsules containing a photohardenable or photosoftenable composition and a color precursor;

assembling said image-wise exposed imaging sheet with a sheet of plain paper;

subjecting said assembly of said imaging sheet and said plain paper to a uniform rupturing force to cause said photosensitive microcapsules to rupture and transfer an image-wise pattern of said color precursor to said plain paper thereby forming a latent image thereon;

separating said imaging sheet from said plain paper;

assembling said plain paper bearing said latent image with a developer donor sheet comprising a support having a layer of a developer on the surface thereof to form a second assembly;

subjecting said second assembly to a uniform force to transfer said developer to said plain paper bearing said latent image whereupon said developer reacts with said color precursor to form a visible image. In the preferred embodiments of the invention, the developer is resin which is transferred as a continuous film to the paper.

DETAILED DESCRIPTION OF THE DRAWINGS

The present invention enables plain paper and other non-reactive supports to be utilized with a cylithographic imaging system; i.e., a system utilizing photosensitive microcapsules. Plain paper is defined to mean paper or board which does not have a developer composition or a similar material associated with the paper, however this definition is not meant to exclude paper that is sized or otherwise surface treated to enhance transfer of the chromogenic material, limit feathering, enhance adhesion or affinity for the developer, etc. The term includes conventional paper, xerographic paper, coated paper, coated board, and other non-reactive substrates including synthetic films for the production of OHP's (overhead transparencies).

Imaging systems utilizing photosensitive microcapsules are described in U.S. Pat. Nos. 4,399,209, 4,440,846, 4,772,530 and 4,772,541 and 4,842,976 (full color). To the extent necessary, the teachings of these patents with respect to the preparation of microcapsules, image-forming agents, developer materials, microencapsulation techniques, color precursors, photosensitive compositions, initiator systems, etc., are hereby incorporated by reference.

Figure 1:
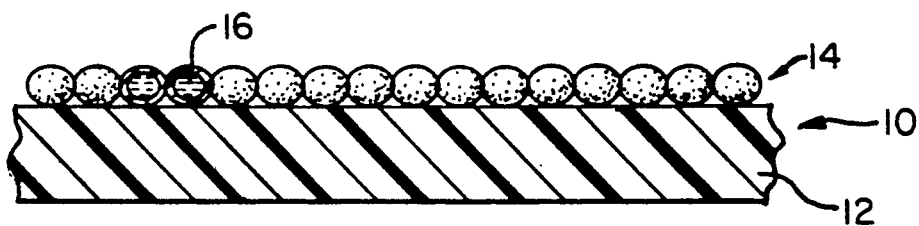
FIG. 1 is a schematic illustration in cross-section of an imaging sheet and used in accordance with the present invention.

FIG. 1 illustrates one embodiment of the imaging system of the present invention. Therein an imaging sheet 10 is shown comprising a substrate 12 coated with a layer of microcapsules 14. The microcapsules are filed with an internal phase 16 comprising a photohardenable or photosoftenable composition including a photoinitiator, and a color precursor. The color precursor is typically a substantially colorless electron donating compound. In the preferred embodiments of the invention the imaging sheets described in U.S. Pat. No. 4,772,541 are used.

Figure 2:
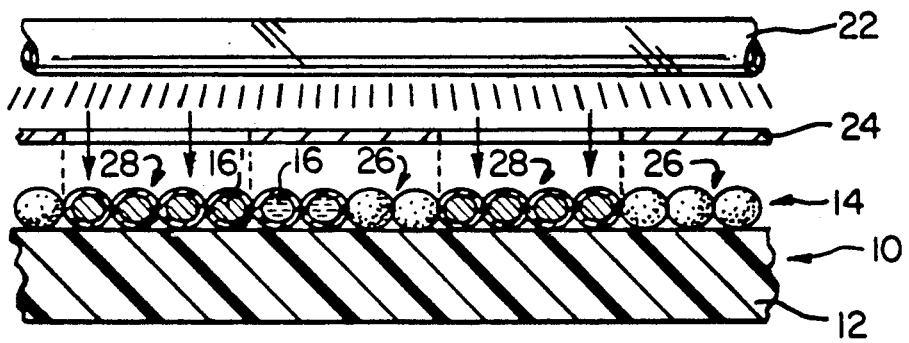
FIG. 2 is a schematic illustration of exposure of the imaging sheet.

Exposure of the imaging sheet 10 by transmission imaging is shown in FIG. 2 wherein a source of radiant energy 22 is positioned adjacent the surface of the imaging sheet 10 with a Mask 24 therebetween. In this illustration the photosensitive material is a positive working radiation curable material. Irradiation of the exposed areas 28 causes the radiation curable material in the internal phase 16 to polymerize, thereby gelling, solidifying or otherwise immobilizing the chromogenic material. To simplify the illustration, internal phase 16' in the exposed areas 28 is shown as a solid whereas the internal phase 16 remains liquid in the unexposed areas 26. Those skilled in the art will appreciate that while transmission imaging has been used to illustrate the invention for its simplicity, reflected light imaging is the common means for copying photographs and printed documents. A reflection or optical projection system may be used for copying ordinary documents as is well-known in other photocopying technologies.

Figure 3:
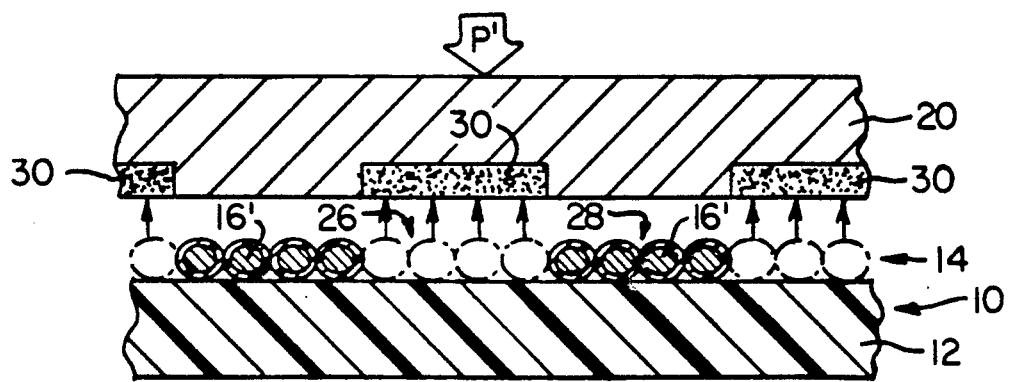
FIG. 3 a schematic illustration of transfer image forming agent to a plain paper receiver sheet to form a latent image thereon.

Transfer of the image forming agent or chromogenic material to a plain paper receiving sheet is shown in FIG. 3 wherein the now exposed imaging sheet 10 is placed with its exposed microcapsule layer 14 in face-to-face contact with plain paper receiving sheet 20 and a pressure P is uniformly applied across the sheets. For simplification, the pressure is shown as rupturing the microcapsules in the unexposed areas 26 and not rupturing the microcapsules in the exposed areas 28. In actuality all the capsules may be ruptured, but the chromogenic material is immobilized by the increased viscosity which results in the internal phase 16' in the exposed areas 28 upon exposure. Typically the capsules are ruptured by passing the imaging sheet 10 and the paper sheet 20 together through a pressure nip. This causes the internal phase 16 from the unexposed areas 26 to transfer to the plain paper receiving sheet 20 as is shown schematically by arrows in FIG. 3. Upon transfer of the internal phase 16 to the plain paper receiving sheet 20, the chromogenic material forms a latent image 30 on the plain paper receiving sheet.

Figure 4A:
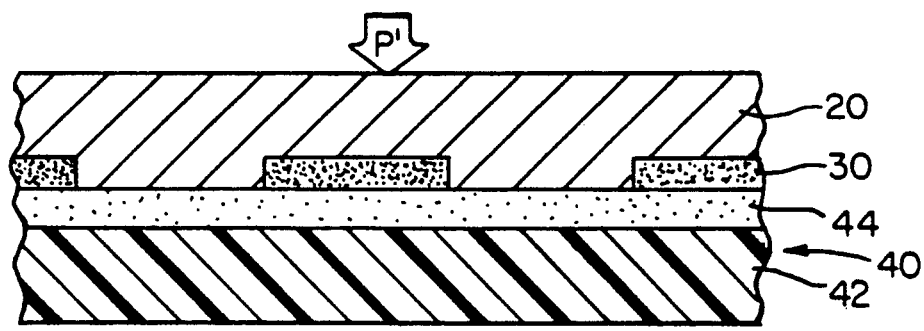
FIGS. 4A and 4B are schematic illustrations of transfer of developing material to a plain paper receiver sheet bearing a latent image, to form a visible image thereon.
Figure 4B:
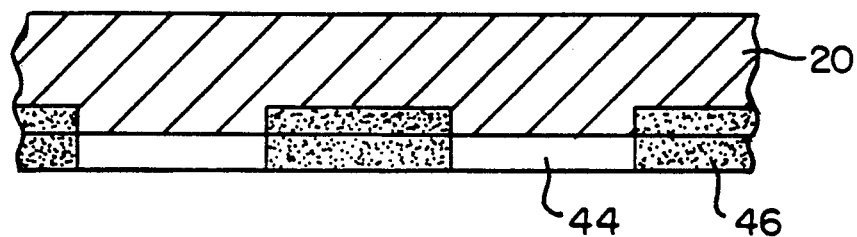

FIGS. 4A and 4B illustrate the development of a visible image from the latent image 30 which has been formed on plain paper receiving sheet 20. Therein a developer-donor sheet 40 is shown comprising a substrate 42 coated with a layer of a developer resin 44. As another embodiment, microcapsules filled with an internal phase containing a liquid developer material which is capable of transferring to a paper sheet and reacting with the image forming agent to form a visible image on plain paper receiving sheet may be used instead of a layer of developer resin. In one embodiment, the developer is a layer of a phenolic resin having the properties of a heat activated adhesive. As shown in FIG. 4A, image formation or development occurs when developer-donor sheet 40 is placed with its developer layer 44 in face-to-face contact with plain paper receiving sheet 20 and a pressure P' is uniformly applied across the sheets to transfer the developer material 44 to the plain paper where it reacts with chromogenic material 30 and forms a visible image 46 on plain paper receiving sheet 20.

Preferably the developer resin is simultaneously heated to cause it to adhere. As shown in FIG. 4B, the image 46 is shown partially in paper sheet 20 and partially in resin layer 44. In actuality it is probably in the resin layer although this has not been determined with certainty.

The visible image is usually the product of an acid-base reaction between the color precursor, which is usually an electron donor, and the developer which is usually an electron acceptor. Alternatively, coupling reactions analogous to those used in color photographic materials or redox reaction pairs may be used. Some of these alternative systems are described in U.S. Pat. No. 4,399,209.

For transfer of the developer material to the plain paper sheet the developer resin is heated prior to or concurrently with its contacting the plain paper sheet. The heating of the developer-donor sheet causes the developer resin present on the developer-donor sheet to become tacky and adhere to the plain paper sheet and release from the developer-donor sheet. This may also impart gloss to the paper as the developer resin will have the surface topography of the film from which it was transferred. The support for the developer donor must be selected or designed such that the adhesion of the developer composition for the paper is greater than its adhesion to the support for embodiments in which it is desired to transfer the developer as a film.

Figure 5:
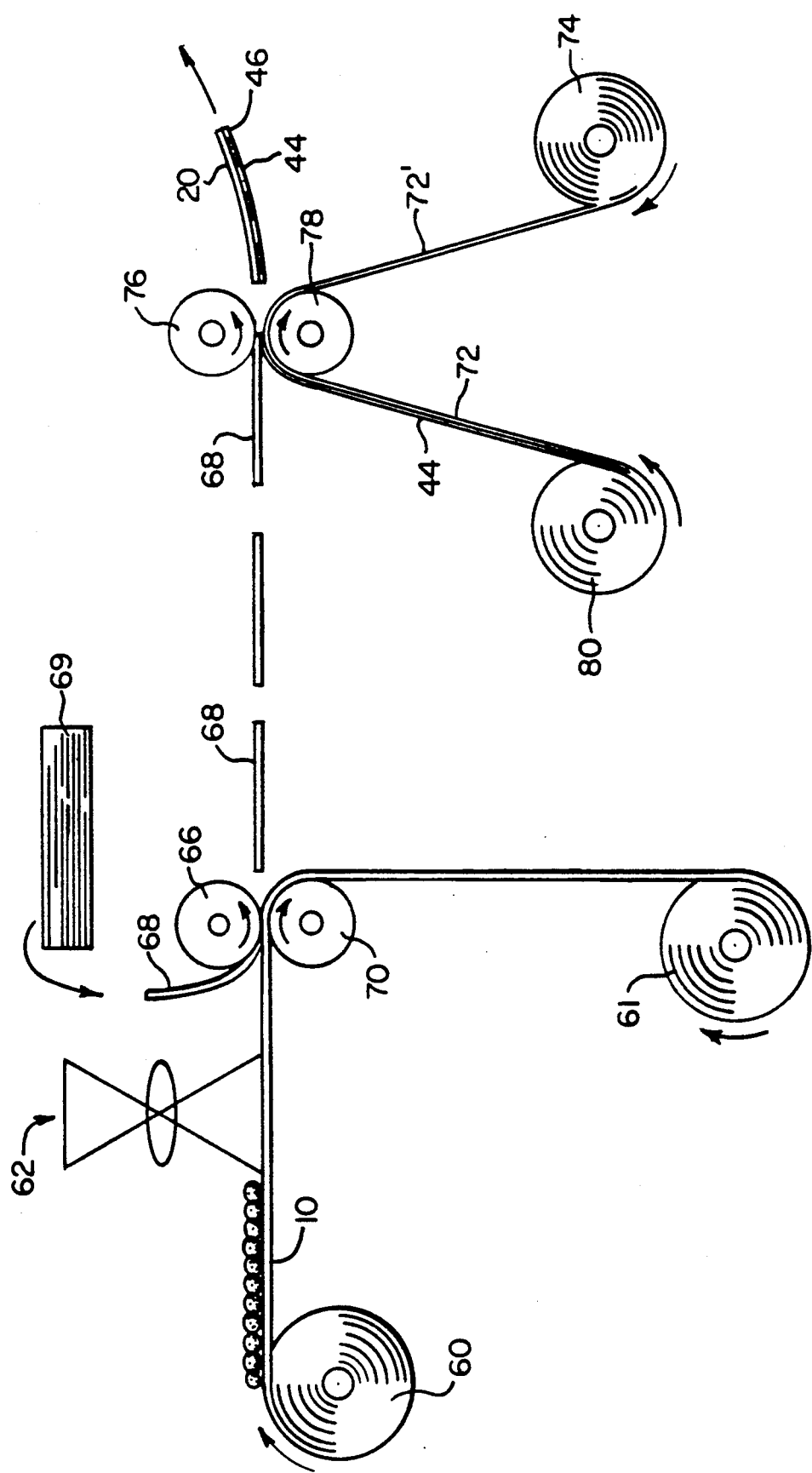
FIG. 5 is a schematic illustration of an apparatus useful in practicing the present invention.

FIG. 5 is a schematic drawing illustrating an apparatus for imaging using plain paper as disclosed in the present invention. Roll 60 dispenses imaging sheet 10 in the direction shown by the arrow and roll 61 subsequently collects imaging sheet 10. As imaging sheet 10 passes under exposure station 62, imaging sheet 10 is exposed in an image-wise pattern causing the microcapsules present on the surface of imaging sheet 10 to photoharden or photosoften in an image-wise pattern depending on the nature of the photosensitive composition they contain. Imaging sheet 10 then passes through the nip between rollers 66 and 70 where it is brought into contact with plain paper sheet 68 which is fed from stack 69. A smooth surface on plain paper receiving sheet 68 is desired, as the smoother the surface the less pressure is required to crush the microcapsules and exude the color precursor. Movement is in the direction shown by the arrow. When imaging sheet 10 is pressed between the nip between pressure rollers 70 and 66, the pressure exerted by the rollers causes the microcapsules on the surface of imaging sheet 10 to rupture thereby transferring a latent image of the color precursor to plain paper sheet 68. Plain paper sheet 68 next is transported to rollers 76 and 78. Roll 80 feeds developer-donor sheet 72 to the nip between rollers 76 and 78. As plain paper sheet 68 passes between the nip of pressure rollers 76 and 78 in contact with developer-donor sheet 72, the developer 44 on the surface of developer-donor sheet 72 is transferred to paper sheet 68 whereby the latent image present on plain sheet 68 reacts with the developer transferred from sheet 27, and is developed to form a visible image. The spent sheet 27 is taken up at roll 74.

The internal phase of microcapsules 14 as described above can be encapsulated in any conventional manner. Oil soluble chromogenic materials have been encapsulated in hydrophilic wall-forming materials such as gelatin wall-forming materials (see U.S. Pat. Nos. 2,730,456 and 2,800,457 to Green et al) including gum arabic, polyvinyl alcohol, carboxymethylcellulose; resorcinol-formaldehyde wall-formers (see U.S. Pat. No. 3,755,190 to Hart et al), isocyanate wall-formers (see U.S. Pat. No. 3,914,511 to Vassiliades) isocyanate-polyol wall-formers (see U.S. Pat. No. 3,796,669 to Kiritani et al) ureaformaldehyde wall-formers and more particularly Urea-resorcinolformaldehyde wall forms(in which oleophilicity is enhanced by the addition of resorcinal) (see U.S. Pat. Nos. 4,001,140; 4,087,376 and 4,089,802 to Foris et al) melamine-formaldehyde resin and hydroxypropyl cellulose (see commonly assigned U.S. Pat. No. 4,0925,455 to Shackle). Preferred methods are described in U.S. Patents Nos. 4,772,530 and 4,772,541. A particularly preferred method for preparing microcapsules is described in U.S. application Ser. No. 073036 filed July 14, 1987.

Microcapsules containing a developer material used in one embodiment may be prepared in a known manner. If the developer is water soluble, a water-in-oil emulsion is formed and the capsule wall is formed around the water droplets. In most cases, however, oil soluble developers will be used and microcapsules containing developers can be prepared in any of the conventional manners disclosed above from an oil-in-water emulsion.

The imaging sheet or donor sheet used in the present invention can be prepared as described in U.S. Pat. No. 4,399,209 and more particularly, for full color imaging, as described in U.S. Pat. No. 4,772,541. In forming a latent image on plain paper, it may be desirable to use an internal phase having a higher viscosity than previously used such that the color precursor is not absorbed into the paper and remains on the surface of the paper where it is accessible to the color developer. This also improves resolution and reduces feathering. Generally, selecting the appropriate internal phase viscosity will involve a balance between the amount of oil which can be exuded by the microcapsules and the amount of oil placed on the surface of the paper for reaction with the developer and feathering tendency. In one embodiment of the invention a viscous or solid monomer is used in formulating the internal phase. The viscosity of these monomers, when liquid, may range from about 200 to 1500 cps at 25° C. and more typically from about 500 to 1500 cps. Many of these compounds are commercially available and include acrylate end-capped or methacrylate end-capped polyesters and polyethers. Examples include ethoxylated bisphenol A diacrylates and melamine acrylates such as tris (2-hydroxyethyl) isocyanurate triacrylate.

As noted, a preferred example of a developer material useful in the present invention is a phenolic resin. These resins may be the condensation product of phenols (including substituted phenols) and formaldehyde. Suitably the phenol formaldehyde molar ratio is usually about 1:1 and the degree of condensation ranges from about 2 to 50, preferably 5 to 20. The resins may be further modified to include amounts of salicylic acids or substituted salicylic acids in a manner known in the art. Examples of phenolic resins useful in the present invention are described in U.S. Pat. Nos. 3,455,721; 3,466,184; 3,672,935; 4,025,490; 4,226,962; and 4,647,952. The phenolic developers are preferably metallated to improve their developing characteristics. They may be metallated by reaction with a salt selected from the group consisting of copper, zinc, aluminum, tin, cobalt and nickel. Most typically, the resins are zincated to improve development. The metal content of the resins generally is about 1 to 5% by weight but may range up to 15%.

Representative examples of these phenol resins are as follows: p-phenylphenol-formaldehyde polymer, p-fluorophenol-formaldehyde polymer, p-chlorophenol-formaldehyde polymer, p-bromophenol-formaldehyde polymer, p-iodophenol-formaldehyde polymer, p-nitrophenol-formaldehyde polymer, p-carboxyphenol-formaldehyde polymer, p-carboalkoxyphenol-formaldehyde polymer, p-aroylphenolformaldehyde polymer, p-lower alkoxyphenol-formaldehyde polymer, p-alkyl(Cl-C12)-phenol-formaldehyde polymers, in which the p-alkyl(Cl-C12)-phenol is p-methylphenol, pethylphenol, p-n-propylphenol, p-isopropylphenol, p-namylphenol, p-isoamylphenol, p-cyclohexylphenol, p-1,1-dimethyl-n-propylphenol, p-n-hexylphenol, p-isohexylphenol, p-1,1-dimethyl-n-butylphenol, p-1,2-dimethyl-n-butylphenol, p-n-heptylphenol, pisoheptylphenol, p-5,5-dimethyl-n-amylphenol, p-1,1-dimethyl-n-amylphenol, p-n-octylphenol, p-1,1,3,3-tetramethylbutylphenol, p-isooctylphenol, p-nnonylphenol, p-isononylphenol, p-1,1,3,3-tetramethylamylphenol, p-n-decylphenol, pisodecylphenol, p-n-undecylphenol, p-isoundecylphenol, p-n-dodecylphenol, etc., and polymers of formaldehyde and isomers of these p-alkyl-phenols where the alkyl groups have 1 to 12 carbon atoms, and copolymers of formaldehyde and mixtures containing two or more of these alkylphenols and the isomers thereof.

More particularly, alkylphenolic resins and, still more particularly, metallated products of alkylphenolic resins are used. The alkyl phenols are monosubstituted by an alkyl group which may contain 1 to 12 carbon atoms. Examples of alkyl phenols are ortho- or para- substituted ethylphenol, propylphenol, butylphenol, amylphenol, hexylphenol, heptylphenol, octylphenol, nonylphenol, t-butylphenol, t-octylphenol, etc.

Another class of thermoplastic tranferrable developer material is a resin-like condensation product of a polyvalent metal salt, such as a zinc salt, and a phenol, a phenolformaldehyde condensation product, or a phenol-salicylic acid-formaldehyde condensation product. This developer material is available from Schenectady Chemical Co. under the designation HRJ 4250 and HRJ 4252. These products are reported to be a metallated condensation product of an ortho- or para-substituted alkylphenol, a substituted salicylic acid, and formaldehyde.

Also useful in the present invention are metal salicylates, which have previously been used as color developers in carbonless paper, such as zinc 3,5-di-t-butylsalicylate and 3,5-di-α-methylbenzylsalicylate. These salicylates may be incorporated in a phenolic resin or they may be admixed with a binder and coated on a support in a manner known in the carbonless paper art.

When the developer is microencapsulated, it is preferably dissolved in a solvent. As such a solvent, natural or synthetic oils can be used individually or in a combination. Specific examples of the solvents include kerosene, paraffin, naphthene oil, alkylated biphenyl, alkylated terphenyl, chlorinated paraffin, alkylated naphthalene, vegetable oils, animal oils, mineral oils, synthetic oils, etc., and the like. Representative examples are vegetable oils such as olive oil, castor oil, cotton seed oil, soybean oil, lemon oil, corn oil, sesame oil and rice oil; animal oils such as fish oil and whale oil; mineral oils such as those obtainable from petroleum, for example, various kinds of paraffins, kerosene and petroleum naphtha; synthetic oils such as alkylated naphthalenes, alkylated diphenyls, alkylated diphenylmethanes, octyl diphthalate, tricresyl phosphate, silicone oil and fluorine-containing oils; organic solvents such as benzene, toluene, zylene and chlorobenzene. Vegetable oils and animal oils themselves tend to yellow, and with oily materials having a low boiling point such as benzene, toluene and xylene, safeguards against explosion need to be observed. Accordingly, aliphatic hydrocarbons, halogenated hydrocarbons and silicone oil are preferred. However, halogenated hydrocarbons and silicone oil cause coated mottles to occur on a coated paper, since they are highly repellant to water. Liquid paraffin is the most preferred oily material, satisfying all the above conditions.

The support for the developer-donor sheet, in accordance with typical embodiments of the invention, may be paper or a synthetic film such as polyethylene terephthalate or a release film or paper such as certain silicone treated products. Synthetic films and release films are preferred as, when compared to paper, they substantially reduce the amount of pressure required to rupture the microcapsules and exude the color precursor. Preferably these films are about 3 to 12 microns thick.

The foregoing resins may be used in the form of a film in which case they will be coated on the support for the developer-donor from a solution or dispersion of the resin. Alternatively, these resins may be used as a finely divided particle in which case they will have been coated from an aqueous emulsion. The developer-donor sheet of the present invention is prepared by coating a support with a coating composition of the developer material using conventional coating techniques. The developer material is usually applied to the surface of the support in an amount of about 8 to 15 g/m2 depending upon the nature of the developer, whether it is encapsulated and whether it is present in a binder or not.

Photocopy apparatuses useful in practicing the method of the present invention can be constructed by modifying known, commercially available color copiers such as the Noritsu ® Slide Printer, the Renaissa CC5500$^R$ from Brother Industries or the Cycolor ® Copier from Seiko-Mead to provide for the developer transfer step.

Having described the invention in detail and by reference to preferred embodiments thereof, it will be apparent that modifications and variations are possible without departing from the scope of the appended claims.

What is claimed is:

1. A method for forming images on plain paper comprising the steps of:
    image-wise exposing an image sheet, said imaging sheet comprising a support having a layer of photosensitive microcapsules on the surface thereof, said microcapsules containing a photohardenable or photosoftenable composition and a color precursor;
    assembling said image-wise exposed imaging sheet with a sheet of plainpaper;
    subjecting said assembly of said imaging sheet and said plain paper to a uniform rupturing force to cause said photosensitive microcapsules to rupture and transfer an image-wise pattern of said color precursor to said plain paper thereby forming a latent image thereon;
    separating said imaging sheet from said plain paper;
    assembling said plain paper bearing said latent image with a developer-donor sheet comprising a support having layer of a developer on the surface thereof to form a second assembly;

subjecting said second assembly to a uniform force to transfer said developer form said developer-donor sheet to said plain paper bearing said latent image whereupon said developer reacts with said color precursor to form a visible image on said plain paper; and separating said plain paper bearing said visible image from said developer-donor sheet.

2. The method of claim 1, wherein said photosensitive microcapsules contain a photohardenable composition.

3. The method of claim 2, wherein said developer is microencapsulated.

4. The method of claim 2 wherein said developer material is present on said developer-donor sheet as a layer of a developer resin on a release sheet.

5. The method of claim 4 wherein said developer is heated upon contacting said plain paper sheet whereby said developer achieves a tacky state and exhibits enhanced adherence to said plain paper sheet.

6. The method of claim 5, wherein said heating is performed by a heated pressure roll.

* * * * *